United States Patent [19]
Choi et al.

[11] Patent Number: 5,801,416
[45] Date of Patent: Sep. 1, 1998

[54] FET HAVING GATE INSULATING FILM OF NONUNIFORM THICKNESS AND ASYMMETRICAL SOURCE AND DRAIN STRUCTURES

[75] Inventors: Yong-bae Choi; Keon-soo Kim, both of Kyungki-do, Rep. of Korea

[73] Assignee: Samsung Electronics Co., Ltd., Kyungki-do, Rep. of Korea

[21] Appl. No.: 590,748

[22] Filed: Jan. 24, 1996

[30] Foreign Application Priority Data

Mar. 13, 1995 [KR] Rep. of Korea .......... 95-5145

[51] Int. Cl.[6] .......................................... H01L 29/78
[52] U.S. Cl. .................. 257/335; 257/491; 257/413; 257/655; 257/408; 257/336; 257/344; 257/496
[58] Field of Search .................. 257/491, 412, 257/413, 655, 409, 408, 335, 336, 344, 404, 285, 496

[56] References Cited

U.S. PATENT DOCUMENTS 5,061,649 10/1991 Takenouchi et al. .............. 437/44
5,401,994  3/1995 Adan ................................. 257/335
5,422,505  6/1995 Shirai ............................... 257/345
5,545,575  8/1996 Cheng et al. ......................... 437/40
5,552,623  9/1996 Nishizawa et al. ................ 257/345

FOREIGN PATENT DOCUMENTS

0315610 11/1993 Japan .............................. 257/408

Primary Examiner—Tom Thomas
Assistant Examiner—David B. Hardy
Attorney, Agent, or Firm—Cushman Darby & Cushman IP Group of Pillsbury Madison & Sutro, LLP

[57] ABSTRACT

A high withstand voltage transistor and a method for manufacturing the same are disclosed. The transistor includes a semiconductor substrate, a field oxide film, a channel region formed of first and second channel regions each having a different concentration level, a gate insulating film having a step difference, a gate electrode having a step difference, a drain region including first, second, and third impurity regions, a source region including first and third impurity regions, a spacer, an interlayer dielectric film and a metal electrode. Threshold voltage can be maintained to an appropriate level, junction break voltage can be increased, and the punchthrough characteristic can also be enhanced.

11 Claims, 6 Drawing Sheets

FET HAVING GATE INSULATING FILM OF NONUNIFORM THICKNESS AND ASYMMETRICAL SOURCE AND DRAIN STRUCTURES

BACKGROUND OF THE INVENTION

The present invention relates to a semiconductor device and a method for manufacturing the same. More particularly, the present invention relates to a high withstand voltage transistor constituting a peripheral circuit of a flash or an electrically erasable and programmable read only memory (EEPROM) which is a nonvolatile memory device operating at high voltage, and a method for manufacturing the same.

In a semiconductor device using a nonvolatile memory, a memory cell is driven by charging or discharging a floating gate with an electrode by supplying a high voltage signal to each node of a storage cell. In general, the high voltage is generated by a boosting circuit inside a chip with a single power supply Vcc. The boosting circuit comprises transistors having excellent voltage withstanding characteristics. The high voltage signal generated by the boosting circuit has a pulse shape and is supplied to each node of a memory cell, thereby changing the state of the memory cell. Accordingly, the voltage for driving the cell is limited by the peripheral boosting circuit. In general, a transistor constituting a boosting circuit should have a withstand voltage characteristic which is higher than the operating voltage for a nonvolatile memory cell.

In general, a high withstand voltage transistor is determined by the following four factors:

first, the point at which the insulation of the gate insulating film between the gate and the drain and between the gate and the source breaks;

second, a junction breakdown between the drain and the substrate;

third, a junction breakdown between the gate electrode and the drain due to concentration of an electrical field; and fourth, the punchthrough characteristics between the source and the drain.

The strength of the electrical field necessary to breakdown the insulating film is fairly consistent and the strength becomes greater in proportion to the thickness of the gate insulating film. Accordingly, to increase the voltage withstand of the gate insulating film, the gate insulating film should be made thicker. For example, a 500 Å oxide film can withstand voltages of 30–50V. When the gate insulating film is formed thick, the threshold voltage of the transistor is increased. Here, in order to maintain the threshold voltage at an appropriate level, the impurity concentration implanted into the channel region should be lowered, which weakens the punchthrough characteristics.

The junction breakdown between the drain and the substrate is proportional to the thickness of the depletion layer formed between the substrate and the drain. That is, as the depletion layer becomes thicker, the tendency for the insulation to breakdown becomes higher. The thickness of the depletion layer is determined by the concentration of the impurity implanted into the substrate and the drain.

The junction breakdown due to the concentration of the electrical field between the gate electrode and the drain is generated at a surface of the drain facing the gate electrode since diffusion of the depletion layer is restrained by the pn-junction. Accordingly, the withstand voltage characteristics at the junction of the drain and the gate electrode is lowered to generate the breakdown at a lower voltage than the withstand voltage at the junction. Here, in general, a drain region having a lower impurity concentration, called a lightly doped drain (LDD) at which the junction withstand voltage is higher than that at the usual drain part is formed and the concentration of the gate electrical field is restricted to the LDD, to prevent lowering of the withstand voltage at the surface.

The punchthrough between the drain and the source is generated by the diffusion of the depletion layer to the source region caused by a high voltage supplied to the drain region. Here, in order to prevent punchthrough, the distance between the source and the drain can be broadened. However, this leads to an increase in the area of the device, thereby preventing integration of the memory cell. The punchthrough can also be prevented by restraining the diffusion of the depletion layer by increasing the impurity concentration of the channel.

In general, in a high voltage transistor, a deep n-junction is formed on a p-type substrate by implanting phosphorus ions having the form of a donor at low concentration into source and drain regions at high energy. The gate insulating film is formed thicker than that of a low voltage transistor used for logic circuits.

However, diffusion of the depletion layer in the direction of the channel during the deep junction formation causes lowering of the punchthrough characteristic. Punchthrough is also generated by a phosphorus region of low concentration which surrounds the region implanted by arsenic (As) ions of high concentration. The threshold voltage of a transistor is increased by using a thick insulating film. However, the characteristic of punchthrough is lowered when lowering the concentration of an impurity implanted into the channel region in order to maintain the threshold voltage at an appropriate level.

In a conventional method for improving punchthrough and breakdown characteristics in a high withstand voltage transistor (see U.S. Pat. No. 5,061,649 "Field Effect Transistor with Lightly Doped Drain Structure and Method for Manufacturing the Same"), the gate insulating film is formed thick, and, further, the impurity concentration of the channel is formed at low concentration obtain an appropriate threshold voltage, which lowers the punchthrough characteristic. The breakdown voltage is increased, since source and drain regions form a deep junction with a low impurity concentration so that scaling down of the channel length is hindered.

A conventional method for manufacturing the high withstand voltage transistor can be described as follows.

Figure 1:
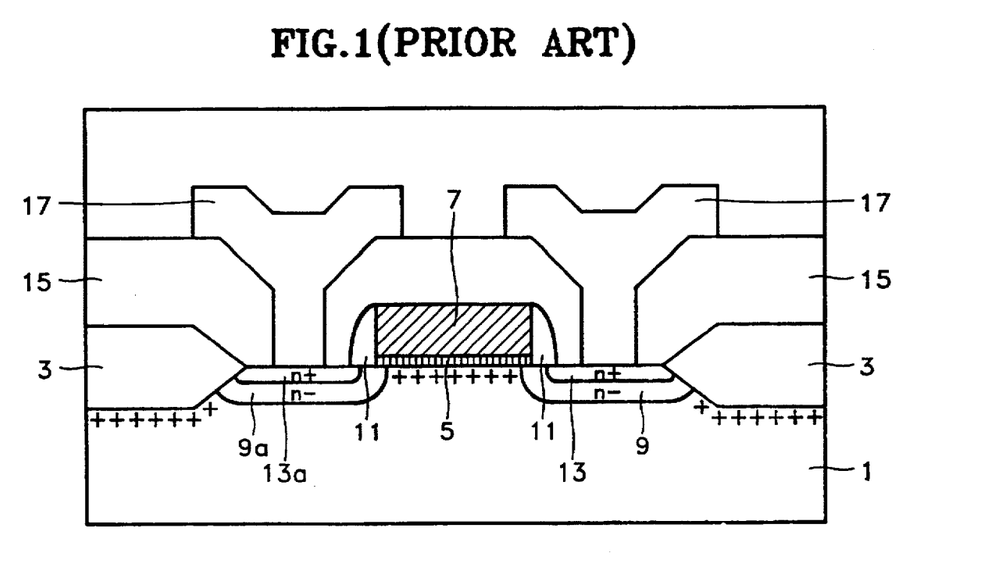
FIG. 1 shows a sectional view of a high withstand voltage transistor by the conventional method.

FIG. 1 is a sectional view of a high withstand voltage transistor manufactured by the conventional method. In detail, field oxide film 3 for isolating the device is formed on p-type substrate 1, and a channel stop region formed of an impurity of the same kind as that of the substrate is located under field oxide film 3. A channel region is formed by ionimplanting the same kind of impurity as that of the substrate to control threshold voltage. Then, a thick gate insulating film 5 is formed on the substrate, and further, polysilicon and silicide are sequentially deposited on gate insulating film 5 and patterned to form the gate electrode 7. Phosphorus is ion-implanted at high energy using gate electrode 7 as a mask to form deep junction impurity regions, 9 and 9a, at low concentration. Spacers 11 for gate electrode 7 are formed by depositing an insulating layer on the surface of the resultant structure from above and etching back the insulating layer. Then, impurity layers 13 and 13a are formed on source and drain regions by ion-implanting arsenic at high concentration using spacers 11 as a mask to lower contact resistance. Subsequently, an interlayer dielectric film 15 is deposited on the whole surface of the resultant structure, and planarized by reflowing. Interlayer dielectric film 15 is patterned to form a contact hole to the source and drain regions. A metal electrode is formed by filling the contact hole with metal 17, to thereby complete the high withstand voltage transistor.

In the conventional method for manufacturing the high withstand voltage transistor, a thick insulating film is formed, and the impurity concentration of the channel is lowered to obtain an appropriate threshold voltage. However, this lowers the punchthrough characteristic. Also, in order to increase the breakdown voltage, source and drain regions form a deep junction with low impurity concentration, which hinders scaling down of the channel length.

SUMMARY OF THE INVENTION

Accordingly, it is an object of the present invention to provide a high withstand voltage transistor having a gate insulating film of varying thickness at different regions, a channel region having different concentrations and an impurity region of the same conductivity as that of the substrate, and source and drain regions having asymmetric impurity distribution.

It is another object of the present invention to provide a method for appropriately manufacturing the above structured high withstand voltage transistor.

To accomplish the above object of the present invention, there is provided a high withstand voltage transistor comprising: a semiconductor substrate; a channel stop region located on the substrate and formed of the same impurity as that of the substrate; field oxide films formed on the channel stop region; a channel region having a nonuniform impurity concentration on an active region between the field oxide films; a gate insulating film having a step difference formed on the channel region; a source and drain region having asymmetrical impurity distribution oil both sides of the channel region; a gate electrode having a step difference formed on the gate insulating film; a spacer formed on the sidewalls of the gate electrode; an interlayer dielectric film having a contact hole formed on the whole surface of the resultant structure; and a metal electrode formed by filling the contact hole.

The channel region comprises a first channel region of low concentration and a second channel region of high concentration. The step difference in the impurity concentration is formed where the first channel region and the second channel region meet each other. The drain includes a shallow first impurity layer at low concentration formed by ion-implanting a conductive impurity opposite that of the semiconductor substrate, a deep second impurity layer at low concentration, and a third impurity layer on a part of the first impurity region at high concentration which has the same depth as that of the first impurity region. It is preferable that the second impurity region is formed of phosphorus. It is also preferable that the third impurity region is formed of arsenic.

The source includes the shallow first impurity region at low concentration formed by ion-implanting an impurity opposite to that of the substrate and a third impurity region at high concentration formed on a part of the first impurity region to the same depth as that of the first region. The third impurity region having high concentration in the source and drain is formed on the whole first impurity region except the lower portion of the spacer of the gate electrode. The interlayer dielectric film consists of either a high temperature oxide (HTO) film or boro-phosphosilicate glass (BPSG).

To accomplish another object of the present invention, there is provided a method for manufacturing a high withstand voltage transistor comprising the steps of: forming a pad oxide film on a semiconductor substrate; forming a nitride film and a channel stop impurity region on the pad oxide film; forming field oxide films on the channel stop impurity region; forming a channel region having a nonuniform impurity concentration on part of an active region between the field oxide films; forming a gate insulating film having a step difference on the semiconductor substrate corresponding to the channel region; forming a gate electrode having a step difference on the gate insulating film; forming a source and drain region having an asymmetrical impurity distribution of low concentration on both sides of the channel region; forming spacers on the sidewalls of the gate electrode; symmetrically implanting an impurity at high concentration onto the source and drain region; forming an interlayer dielectric film having a contact hole on the whole surface of the semiconductor substrate; and forming a metal electrode by filling the contact hole with a metal.

For the semiconductor substrate, a p-type or n-type substrate can be used. The impurity is formed by ion-implanting a p-type material. The pad oxide film is formed to a thickness of 300 Å. The nitride film defines an active region and is formed to a thickness of 1,500 Å by using a low pressure chemical vapor deposition (LPCVD) method. To form the channel stop region, it is preferable to pattern a photoresist, to overlap the active region by a distance longer than the predetermined distance (0.5μm). Accordingly, the channel stop region is formed spaced from the "bird's beak" of the field oxide film. It is preferable to form the field oxide film to a thickness of approximately 5,000 Å so that the channel stop region is spaced at a predetermined distance from the active region. To control the threshold voltage, it is preferred that the channel region comprises a first channel region at low concentration formed by ion-implanting an impurity of the same conductivity as that of the semiconductor substrate and a second channel region at high concentration. The gate insulating film includes a thick first gate insulating film and a thin second gate insulating film, where the first gate insulating film region is formed on the first channel region, and the second gate insulating film region is formed on the second channel region. The drain region comprises the shallow first and deep second impurity regions at low concentration formed of a conductive impurity opposite to that of the semiconductor substrate and a thin third impurity region at high concentration. Here, the deep second impurity region is formed by ion-implanting phosphorus, the third impurity region is formed by ion-implanting arsenic, and the first impurity region is formed by ion-implanting boron onto the whole surface of the semiconductor substrate. The source includes the first impurity region and the third impurity region.

According to the present invention, a gate insulating film having a different thickness at each region, a channel region at nonuniform impurity concentration, and source and drain regions having an asymmetrical impurity distribution enable the characteristics of breakdown, punch-through, and threshold voltage to be enhanced.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 2:
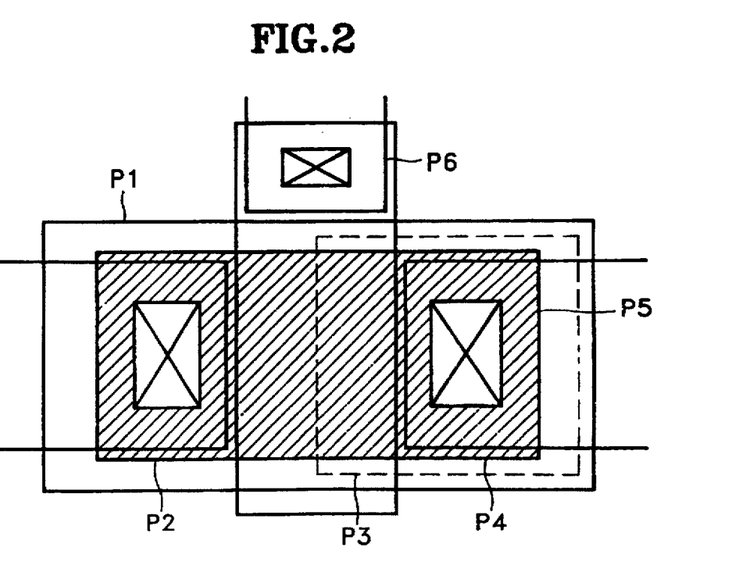
FIG. 2 is a layout view showing a layout of a mask pattern used for the present invention.

FIG. 2 shows a layout of the mask pattern used for the present invention. In detail, reference code P1 shows a mask for defining the region where channel stop impurities are ion-implanted. Reference code P3, shows a mask used for controlling the impurity concentration of the channel region, and for controlling the thickness of the gate insulating film. Reference code P5 is a mask pattern for defining an active region and reference code P6 is a mask pattern for defining the gate electrode. It is preferable to form mask P1 so that it is isolated from mask pattern P5 by an appropriate distance of equal to or greater than 0.5μm. It is also preferable to pattern mask P3 to cover about half of mask pattern P5.

Figure 3:
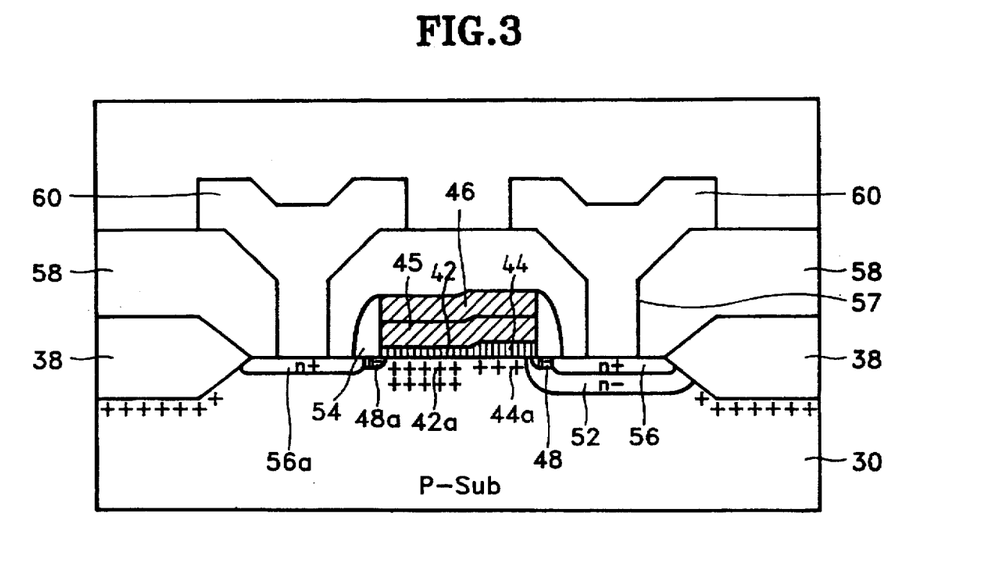
FIG. 3 is a sectional view of the structure of a high withstand voltage transistor according to the present invention.

FIG. 3 shows a sectional view of the structure of a high withstand voltage transistor according to the present invention. As shown in FIG. 3, thick field oxide film 38 for isolating the device is located on semiconductor substrate 30 and a channel stop region formed of an impurity of the same kind as that of the substrate is located under the substrate. The channel stop impurity region is formed separated from the "bird's beak" of field oxide film 38 at a predetermined distance. The channel region for controlling the threshold voltage is formed by implanting the same impurity as that of the substrate and includes a first channel region 44a and a second channel region 42a. On the channel region, first and second gate insulating films 44 and 42 are formed, and a doped polysilicon layer 45 and a doped tungsten silicide layer 46 are sequentially formed thereon. Doped polysilicon and silicide layers 45 and 46 constitute a gate electrode. To the right and to the left of the gate electrode, shallow drain and source regions (first impurity region) 48 and 48a are formed by ion-implanting an impurity opposite to that of the substrate at low concentration into the whole surface of the substrate. Subsequently, a deep second impurity region 52 is formed by ion-implanting phosphorus into the drain region at low concentration. In the source and drain region, third impurity regions 56 and 56a, which are deeper than first impurity regions 48 and 48a of high concentration and shallower than second impurity region 52, are formed. Then, an interlayer dielectric film 58 having contact holes 57 are formed on the whole surface of the resultant structure, metal electrodes 60, formed by filling contact hole 57, are formed on interlayer dielectric film 58.

A method for forming a high withstand voltage transistor having the above structure will be described in more detail with reference to FIGS. 4 through 12.

Figure 4:
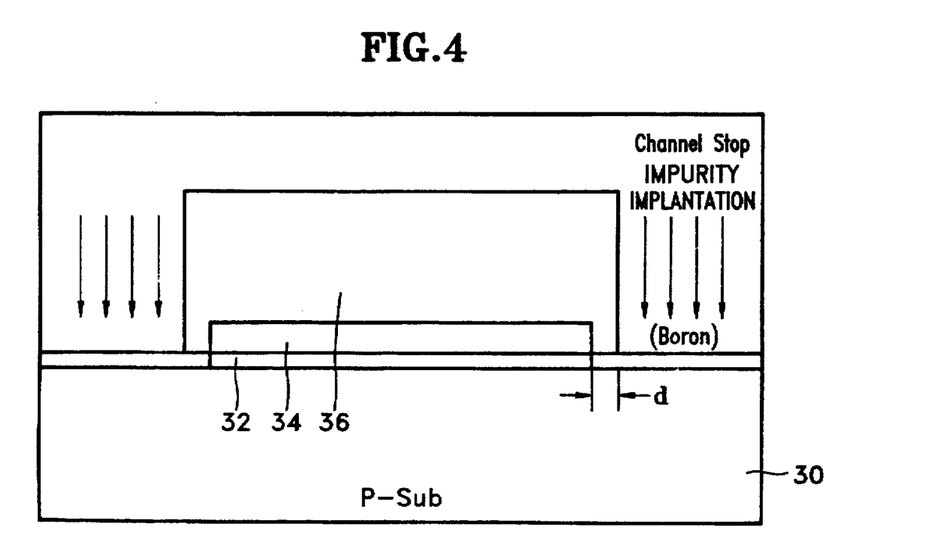
FIGS. 4 through 12 are view showing manufacturing processes of a high withstand voltage transistor according to the present invention.

FIG. 4 shows the step of forming the channel stop impurity region. In detail, pad oxide film 32 is deposited on semiconductor substrate 30 to a thickness of approximately 300 Å. Then, nitride film 34 is formed on pad oxide film 32 to a thickness of 1,500 Å by a low pressure chemical vapor deposition (LPCVD) method to perform the process of local oxidation of silicon (LOCOS). An active region and an inactive region are defined by coating a photoresist film (not shown) on nitride film 34. Nitride film 34 is etched using the patterned photoresist film as a mask. The photoresist film is eliminated, and then photoresist pattern 36 which overlaps the active region by a predetermined distance (d:0.5μm) is formed on nitride film 34 in order to form the channel stop impurity region. Here, the channel stop impurity region is formed separated from the "bird's beak" by a predetermined distance. An impurity, boron (B), of the same kind as that implanted into the substrate is ion-implanted onto the substrate having the resultant structure, to thereby form the channel stop impurity region.

Figure 5:
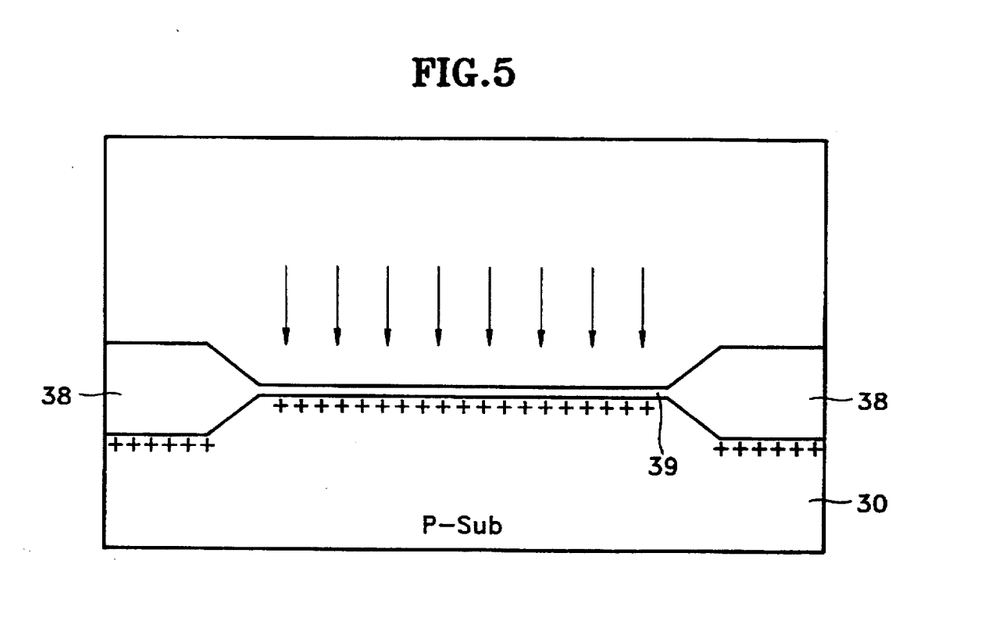

FIG. 5 shows the step of ion-implanting a first impurity for forming the field oxide film and controlling the threshold voltage. In detail, photoresist pattern 36 in FIG. 4 is eliminated by etching. When the resultant structure is oxidized under an oxidation atmosphere, field oxide film 38 is formed on the channel stop region to a thickness of approximately 5,000 Å. The channel stop impurity region is formed separated from the active region by the bird's beak due to the predetermined overlapping distance "d" of photoresist pattern 36. Then, nitride film 34 and pad oxide film 32 are eliminated, to thereby expose the surface of the semiconductor substrate of the active region. Further, a thin sacrificial oxide film (not shown) is grown on the active region. The first impurity which is same as that of the substrate is ion-implanted on the whole surface of the sacrificial oxide film to control the threshold voltage. The sacrificial oxide film is eliminated by wet-etching, and then first gate insulating film 39 is formed on the whole surface of the active region by thermal oxidation.

Figure 6:
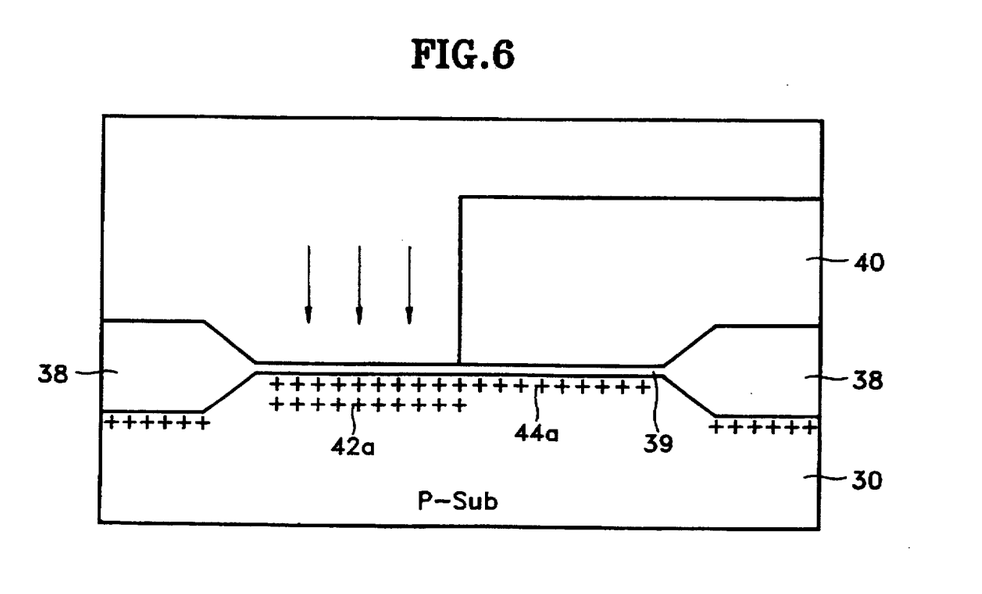

FIG. 6 shows the step of ion-implanting a second impurity for controlling the threshold voltage. In detail, photoresist pattern 40 for defining half of the active region is formed on the resultant structure. A second impurity of the same kind as that of the first impurity is ion-implanted onto an active region where photoresist pattern 40 is not formed to control the threshold voltage of the high withstand voltage transistor. Then, the first gate insulating film of the part where the second impurity is ion-implanted is eliminated. Photoresist pattern 40 is also eliminated. Accordingly, a channel region including impurities of the same kinds having different concentrations is formed.

Figure 7:
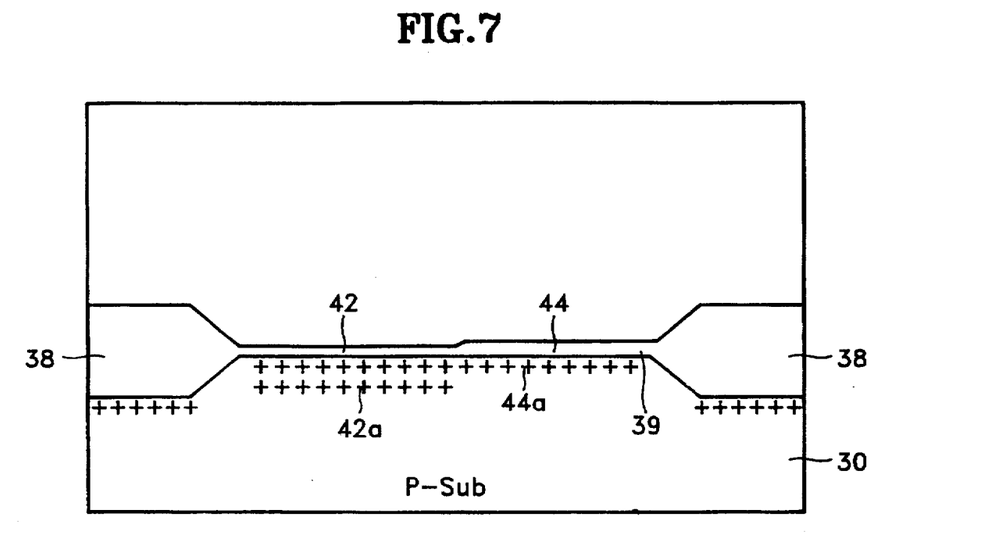

FIG. 7 shows the step of forming second gate insulating film 42. In detail, second gate insulating film 42 is grown on the whole surface which is the substrate including the resultant structure to a thickness of the same as that of the first gate insulating film. Accordingly, a first duplicate-layered gate insulating film region 44 including first gate insulating film 39 in FIG. 6 and second gate insulating film 42 is formed on the part where the second impurity for controlling the threshold voltage is not implanted.

Meanwhile, a second gate insulating film region consisting of only second gate insulating film 42 is formed on the part where the second impurity is ion-implanted in order to control the threshold voltage. As a result, the gate insulating film regions have a step caused by the level difference thereof on the substrate of the active region.

Figure 8:
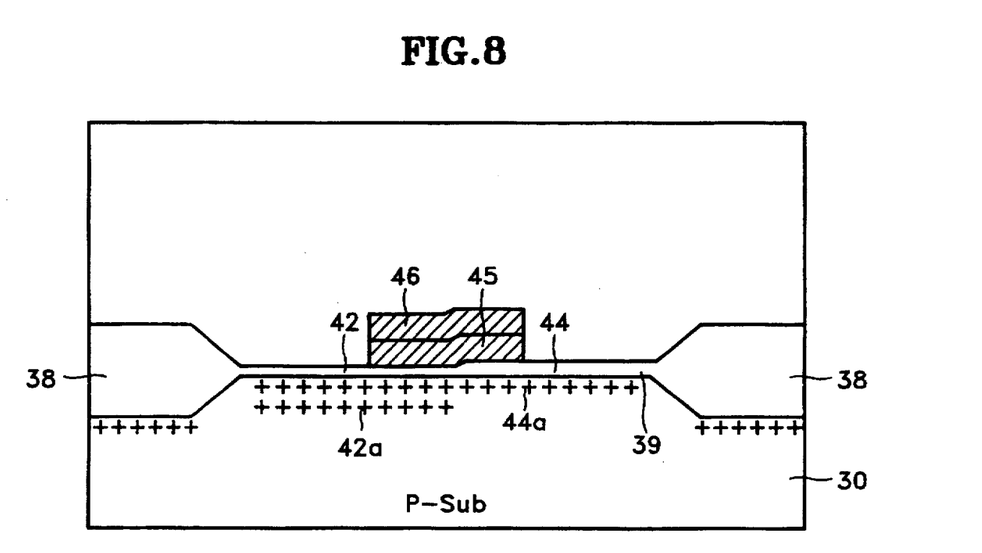

FIG. 8 shows the step of forming the gate electrode. In detail, doped polysilicon layer 45 and doped silicide layer 46 are formed on gate insulating films 42 and 44, and then patterned with the step difference of gate insulating films 42 and 44 being included. Patterned polysilicon layer 45 and patterned silicide layer 46 constitute the gate electrode.

As a result, the gate electrode has a step difference corresponding to the step difference of gate insulating films 42 and 44.

Figure 9:
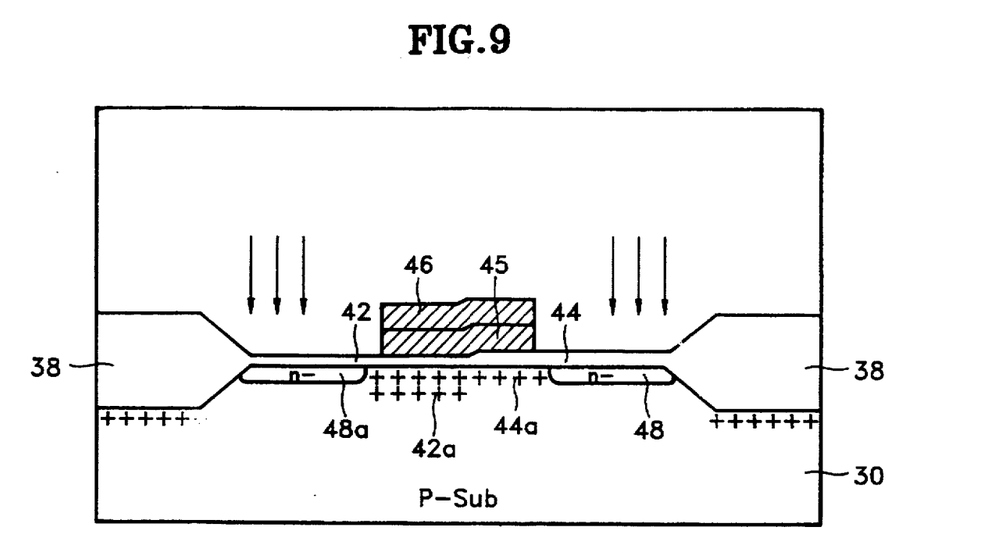

FIG. 9 shows the step of forming the first impurity region of the source and drain regions. In detail, phosphorus at low energy is ion-implanted to the region where the source and drain regions of a high withstand voltage transistor is formed without a mask. As a result, shallow first impurity regions 48 and 48a at low concentration which are formed of n are formed on the source and drain region.

Figure 10:
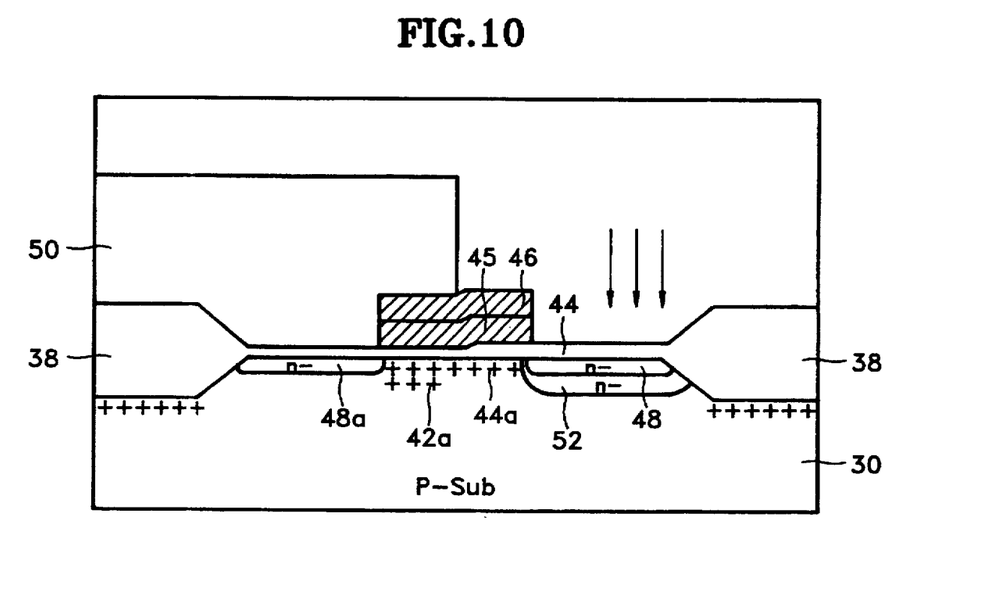

FIG. 10 shows the step of forming a second impurity region on the drain region. In detail, photoresist pattern 50 covering all of the source region and half of the gate electrode is formed on the resultant structure of FIG. 9. A conductive impurity, i.e., phosphorus having high energy is ion-implanted onto the whole surface of the resultant structure. Next, photoresist pattern 50 is eliminated, and the resultant structure is driven in to thereby activate the impurity. Thus, second impurity region 52 of a deep n-junction layer is formed on the drain region.

Figure 11:
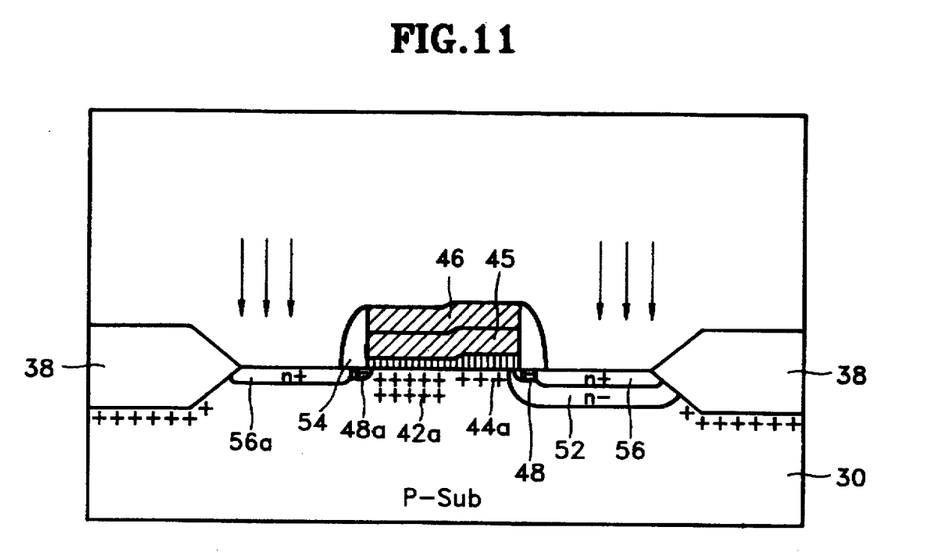

FIG. 11 shows the step of forming a spacer and ion-implanting to lower the contact resistance of the source and drain regions. In detail, HTO is formed on the resultant structure of FIG. 9 by a chemical vapor deposition (CVD) method. Spacers 54 are formed on the sidewalls of gate electrodes 45 and 46 by etching-back the HTO. Then, an arsenic (As) impurity at high concentration is ion-implanted onto the source and drain regions using spacers 54 as a mask. As a result, third impurity regions 56 and 56a consisting of n⁺ which is deeper than the first impurity region and shallower than the second impurity region are formed. Thus, the contact resistance of the source and drain regions is lowered, to thereby complete the source and drain impurity regions. Here, since arsenic ions having large mass have a short diffusion distance, an insulating film of a corresponding region is eliminated before the arsenic ions are implanted.

Figure 12:
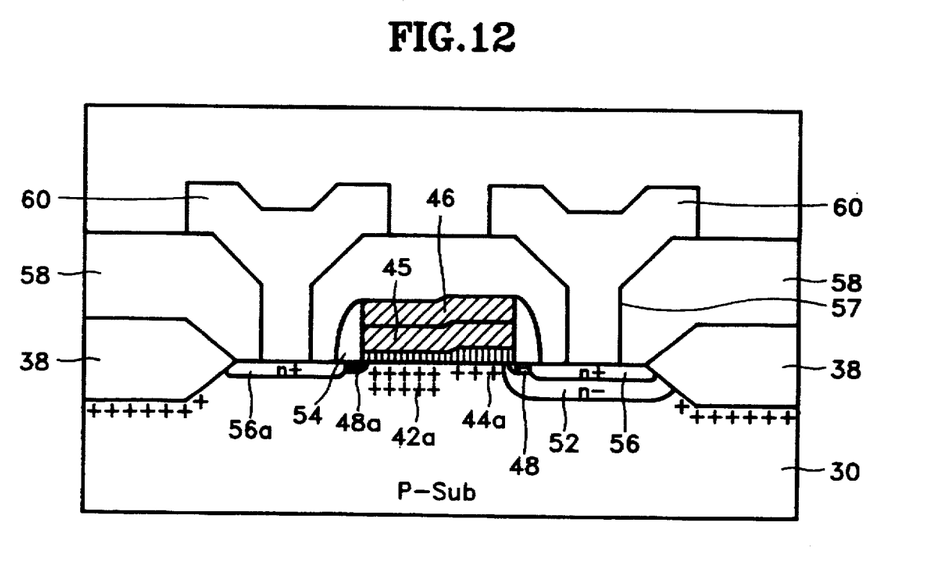

FIG. 12 shows the step of forming an interlayer dielectric film and a metal electrode. In detail, interlayer dielectric film 58 is deposited on the resultant structure of FIG. 11, and planarized by the reflowing process. Contact hole 57 is formed on a source and drain region by patterning interlayer dielectric film 58. A metal film is deposited on interlayer dielectric film 58 and contact hole 57, and then patterned, to thereby form metal electrode 60 of the source and drain regions. Thus, the high withstand voltage transistor is completed. Here, interlayer dielectric film 58 is formed of either HTO or BPSG.

According to the present invention, to maintain a threshold voltage of a high withstand voltage transistor at an appropriate level on a channel region, first channel region 44a is formed under thick gate insulating film layer 44 formed of duplicate layers of the first and second gate insulating films having different concentrations and the same impurities as that of the substrate. This appropriately lowers the increase of the threshold voltage due to the thickness of the gate insulating film, and second channel region 42a compensates for lowering of the threshold voltage due to the thickness of second insulating layer region 42. Not only is there an asymmetrical impurity distribution on the channel region, but there is also an asymmetrical junction structure of the source and drain regions formed so that the punch-through characteristic can be enhanced. The third impurity region is completely included in the second impurity region so that the breakdown voltage is increased.

It should be understood that the invention is not limited to the illustrated embodiment and that many changes and modifications can be made within the scope of the invention.

What is claimed is:
1. A high withstand voltage transistor comprising:
   a semiconductor substrate;
   a channel stop region located on said substrate and formed of the same impurity as that of said substrate;
   field oxide films formed on said channel stop region;
   a channel region having a nonuniform impurity concentration on an active region between said field oxide films;
   a gate insulating film having a step difference formed on said channel region;
   a source and drain region having asymmetrical impurity distribution on both sides of said channel region, said source and drain region being LDD structures and said asymmetrical impurity distribution of said source and drain region having n⁺ and n⁻ type impurities, respectively;
   a gate electrode having a step difference formed on said gate insulating film;
   a spacer formed on the sidewalls of said gate electrode;
   an interlayer dielectric film having a contact hole formed on the whole surface of the resultant structure; and
   a metal electrode formed by filling said contact hole;
   wherein said channel region comprises a first channel region at low concentration and a second channel region at high concentration formed by ion-implanted impurities of the same conductivity type as that of the semiconductor substrate; and
   wherein a first gate insulating film region is formed on said first channel region, and a second gate insulating film region is formed on said second channel region.

2. A high withstand voltage transistor according to claim 1, wherein said first gate insulating film region comprises a thick insulating film and said second gate insulating film region comprises a thin insulating film.

3. A high withstand voltage transistor according to claim 1, wherein said first channel region is adjacent to said drain region, and said second region is formed adjacent to said source region.

4. A high withstand voltage transistor comprising:
   a semiconductor substrate;
   a channel stop region located on said substrate and formed of the same impurity as that of said substrate;
   field oxide films formed on said channel stop region;
   a channel region having a nonuniform impurity concentration on an active region between said field oxide films;
   a gate insulating film having a step difference formed on said channel region;
   a source and drain region having asymmetrical impurity distribution on both sides of said channel region, said source and drain region being LDD structures and said asymmetrical impurity distribution of said source and drain region having n⁺ and n⁻ type impurities, respectively;
   a gate electrode having a step difference formed on said gate insulating film;
   a spacer formed on the sidewalls of said gate electrode;
   an interlayer dielectric film having a contact hole formed on the whole surface of the resultant structure; and
   a metal electrode formed by filling said contact hole;
   wherein said gate insulating film comprises a thick first gate insulating film region and a thin second gate insulating film region; and wherein said first gate insulating film region is formed on a first channel region, and said second gate insulating film region is formed on a second channel region.

5. A high withstand voltage transistor according to claim 4, wherein said first channel region comprises a low concentration of impurities and said second channel region includes a high concentration of impurities, said impurities being the same conductivity type as that of said semiconductor substrate.

6. A high withstand voltage transistor according to claim 4, wherein said first channel region is adjacent to said drain region, and said second region is formed adjacent to said source region.

7. A high withstand voltage transistor comprising:

a semiconductor substrate;

a channel stop region located on said substrate and formed of the same impurity as that of said substrate;

field oxide films formed on said channel stop region;

a channel region having a nonuniform impurity concentration on an active region between said field oxide films;

a gate insulating film having a step difference formed on said channel region;

a source and drain region having asymmetrical impurity distribution on both sides of said channel region, said source and drain region being LDD structures and said asymmetrical impurity distribution of said source and drain region having $n^+$ and $n^-$ type impurities, respectively;

a gate electrode having a step difference formed on said gate insulating film;

a spacer formed on the sidewalls of said gate electrode;

an interlayer dielectric film having a contact hole formed on the whole surface of the resultant structure; and a metal electrode formed by filling said contact hole;

wherein said drain region includes shallow first and deep second impurity regions at low concentration formed of an opposite conductive impurity to that of said semiconductor substrate and a shallow third impurity region at high concentration.

8. A high withstand voltage transistor according to claim 7, wherein said second impurity region is arranged below said third impurity region.

9. A high withstand voltage transistor according to claim 7, wherein said third impurity region is formed spaced from said gate electrode by a predetermined distance so that said third impurity region does not overlap with said gate electrode.

10. A high withstand voltage transistor comprising:

a semiconductor substrate;

a channel stop region located on said substrate and formed of the same impurity as that of said substrate;

field oxide films formed on said channel stop region;

a channel region having a nonuniform impurity concentration on an active region between said field oxide films;

a gate insulating film having a step difference formed on said channel region;

a source and drain region having asymmetrical impurity distribution on both sides of said channel region, said source and drain region being LDD structures and said asymmetrical impurity distribution of said source and drain region having $n^+$ and $n^-$ type impurities, respectively;

a gate electrode having a step difference formed on said gate insulating film;

a spacer formed on the sidewalls of said gate electrode;

an interlayer dielectric film having a contact hole formed on the whole surface of the resultant structure; and a metal electrode formed by filling said contact hole;

wherein said source region includes a shallow first impurity region at low concentration and a shallow third impurity region at high concentration.

11. A high withstand voltage transistor according to claim 10, wherein said third impurity region is formed spaced from said gate electrode by a predetermined distance so that said third impurity region does not overlap with said gate electrode.

* * * * *